(12) United States Patent  (10) Patent No.: US 8,507,805 B2
Fujii  (45) Date of Patent: Aug. 13, 2013

(54) WIRING BOARD FOR SEMICONDUCTOR DEVICES, SEMICONDUCTOR DEVICE, ELECTRONIC DEVICE, AND MOTHERBOARD

(75) Inventor: Seiya Fujii, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 841 days.

(21) Appl. No.: 12/362,670

(22) Filed: Jan. 30, 2009

(65) Prior Publication Data

US 2009/0196003 A1 Aug. 6, 2009

(30) Foreign Application Priority Data

Jan. 31, 2008 (JP) .................................. 2008-021376

(51) Int. Cl.
*H05K 1/16* (2006.01)
*H01L 21/56* (2006.01)

(52) U.S. Cl.
CPC .................................. *H01L 21/561* (2013.01)
USPC ......................................... 174/260; 174/256

(58) Field of Classification Search
CPC .................................................. H01L 21/561
USPC ................ 174/260, 256, 258, 261; 361/777, 361/760, 767, 768
See application file for complete search history.

(56) References Cited

U.S. PATENT DOCUMENTS

| 6,441,316 | B1 * | 8/2002 | Kusui ............................. 174/260 |
| 6,448,504 | B1 * | 9/2002 | Taguchi ......................... 174/255 |
| 6,958,527 | B2 | 10/2005 | Hanaoka |
| 6,987,323 | B2 * | 1/2006 | Yamane ......................... 257/775 |
| 2005/0230829 | A1 * | 10/2005 | Watanabe et al. ............. 257/738 |
| 2011/0198760 | A1 * | 8/2011 | Shibuya ......................... 257/784 |

FOREIGN PATENT DOCUMENTS

| JP | 2001068836 A | 3/2001 |
| JP | 2002134649 A | 5/2002 |
| JP | 2003-197674 | 7/2003 |
| JP | 2003-243813 | 8/2003 |
| JP | 2004128290 A | 4/2004 |
| JP | 2004134606 A | 4/2004 |
| JP | 2005268575 A | 9/2005 |

OTHER PUBLICATIONS

Official Action issued on Aug. 17, 2011 by the Japanese Patent Office in corresponding Japanese Application No. 2008-021376 and English Translation of portion within wavy lines.

* cited by examiner

*Primary Examiner* — Yuriy Semenenko
(74) *Attorney, Agent, or Firm* — Young & Thompson

(57) ABSTRACT

In a wiring board according to the present invention, a substrate, a solder resist provided on the substrate, a land, a wiring line, and a connection portion connecting the wiring line and the land, the connection portion is provided with a recess as a non-flat portion, and is formed to comprise a width greater than a width of the wiring line and smaller than a width (diameter) of the land, the width of the connection portion being gradually increased from the wiring line toward the land.

18 Claims, 16 Drawing Sheets

WIRING BOARD FOR SEMICONDUCTOR DEVICES, SEMICONDUCTOR DEVICE, ELECTRONIC DEVICE, AND MOTHERBOARD

This application is based upon and claims the benefit of priority from Japanese patent application No. 2008-021376, filed Jan. 31, 2008, the disclosure of which is incorporated herein in its entirety by reference.

BACKGROUND OF THE INVENTION

1. Field of the Invention

The present invention relates to a wiring board for semiconductor devices for mounting semiconductor elements thereon, a semiconductor device comprising a wiring board for semiconductor devices, an electronic device using a semiconductor device, a motherboard comprising characteristics of the present invention, a method of manufacturing a wiring board for semiconductor devices, a method of manufacturing a semiconductor device using a wiring board for semiconductor devices, a method of manufacturing an electronic device comprising such a semiconductor device, and a method of manufacturing an electronic device comprising semiconductor and electronic components mounted on a motherboard comprising the characteristics of the present invention.

In recent years, the size reduction and performance enhancement of electronic equipment comprise pushed the increase in degree of integration and size reduction of semiconductor elements used in the electronic equipment.

This is achieved, for example, by a connection structure for connection between a substrate and semiconductor elements, in which a conductor pedestal called "land" is provided on the substrate so that a contact member such as a solder ball provided on the land is connected to another substrate or the like.

When employing such a structure, the sizes of the land and the contact member must be reduced in order to increase the degree of integration and the number of terminals of the semiconductor elements.

However, the size reduction of the land and contact member inevitably involves the reduction of the contact area, which possibly deteriorates the bonding strength.

Therefore, a structure is required to prevent the deterioration in the bonding strength due to the size reduction of the land and the contact member.

An NSMD (Non Solder Mask Defined) structure is one of such structures to prevent the deterioration in the bonding strength between the land and the contact member.

The NSMD structure is a structure in which a gap is provided between the land and a solder resist, so that the contact member is in contact not only with the top face of the land but also the side faces of the land, whereby the bonding strength between the land and the contact member is enhanced.

However, even in the NSMD structure, a connection portion (neck portion) where the land is connected with a wiring line assumes an SMD (Solder Mask Defined) structure in which a contact member is not in contact with the sides faces of the land.

Therefore, when subjected to a stress, the semiconductor device often suffers fracture of the contact member which progresses from the SMD portion (neck portion) where the connection with the contact member is weak.

Thus, a structure to prevent such fracture is required in some cases.

2. Description of Related Art

The structure to prevent the fracture is for example achieved by a structure in which an annular support portion is provided around the terminal portion of the land and a plurality of joining portions are used to connect between the terminal portion and the support portion.

For example, Japanese Laid-Open Patent Publication No. 2003-243813 (Patent Document 1) shows, in FIG. 1, a terminal structure for a BGA (Ball Grid Array) semiconductor device in which a land for soldering a ball comprises a terminal portion, a support portion arranged in the vicinity of the outer periphery of the terminal portion, and a joining portion for joining the terminal portion with the support portion, and an insulating layer is provided on the substrate to cover the support portion while leaving the terminal portion exposed, so that the ball is soldered to the terminal portion with the solder extending over the surface of the terminal portion and the edge.

Japanese Laid-Open Patent Publication No. 2003-197674 (Patent Document 2), for example, describes a technique to absorb any expansion caused by a difference in coefficient of thermal expansion between a semiconductor device and a packaging board.

According to Patent Document 2, in summary, a BGA semiconductor device comprises a terminal configuration in which a recessed portion is formed in the vicinity of an external terminal, and a wiring line is projected from a side face of the recessed portion while the wiring line is curved to be connected to a land.

SUMMARY OF THE INVENTION

In the structure as described in Patent Document 1, the land is connected by a plurality of joining portions from the support portion, which improves the bond strength between the wiring board and the land. However, the land is connected by means of the joining portions, and the bases of these joining portions assume an SMD structure.

This may result in a problem that stress generated in the semiconductor device causes fracture of the solder balls to progress from the SMD part where the joint with the solder is weak, and such fracture of the solder balls lead to deterioration in reliability of secondary packaging of the semiconductor device.

Further, in the structure as described above, the support portion is formed around the terminal portion of each land, which results in increased pitch between the lands and may lead to increased size of the wiring board.

Further, as for a multiple wiring board in which wiring lines must be laid between lands, the disadvantages will become more significant. Specifically, the size of the wiring board is increased, and hence the size of the semiconductor device is also increased.

On the other hand, in the structure as described in Patent Document 2, a wiring line is projected from a side face of a recessed portion and curved to be connected to a land, which alleviates the stress generated by a difference in coefficient of thermal expansion between a semiconductor device and a packaging board. However, a bridge (neck portion) connected to the land is formed comprising a width similar to that of the wiring line and hence is highly likely broken when subjected to an impact shock.

The present invention seeks to solve one or more of the above problems, or to improve upon those problems at least in part.

In one embodiment, there is provided a wiring board for semiconductor devices, comprising: a substrate; a land provided on the substrate to mount a contact member thereon; a wiring line provided on the substrate to be connected to the land; a connection portion provided between the wiring line and the land on the substrate to connect between the land and the wiring line, the connection portion being in contact with the contact member; and a solder resist provided to cover the surface of the substrate, and arranged not to be in contact with the land and the connection portion, wherein the connection portion comprises a width which is equal to or greater than that of the wiring line and equal to or smaller than that of the land, the width of the connection portion being gradually increased from the wiring line toward the land; and a non-flat portion is provided in a part of the surface of the connection portion where the connection portion is in contact with the contact member.

In another embodiment, there is provided a method of manufacturing a wiring board for semiconductor devices comprising: (a) etching selectively a metal thin film preformed on a substrate to thereby form a land, a wiring line connected to the land, and a connection portion provided between the wiring line and the land to connect the land and the wiring line and to be in contact with a contact member, wherein the (a) comprises: forming the connection portion to comprise a width greater than a width of the wiring line and smaller than a width of the land, the width of the connection portion being gradually increased from the wiring line toward the land; and providing a non-flat portion in the surface of a part of the connection portion in contact with the contact member.

Effects of the Invention:

According to the present invention, it is possible to provide a wiring board with a higher reliability than conventional ones, in which the bond strength between a contact member and a connection portion (neck portion) connecting between a wiring line and a land is enhanced without changing the land diameter or the pitch between wiring lines according to a conventional technique to reinforce the starting point of possible cracks, and the connection portion (neck portion) connecting between the wiring line and the land is made resistive against breakage when subjected to an impact shock.

BRIEF DESCRIPTION OF THE DRAWINGS

The above features and advantages of the present invention will be more apparent from the following description of certain preferred embodiments taken in conjunction with the accompanying drawings, in which.

DETAIL DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
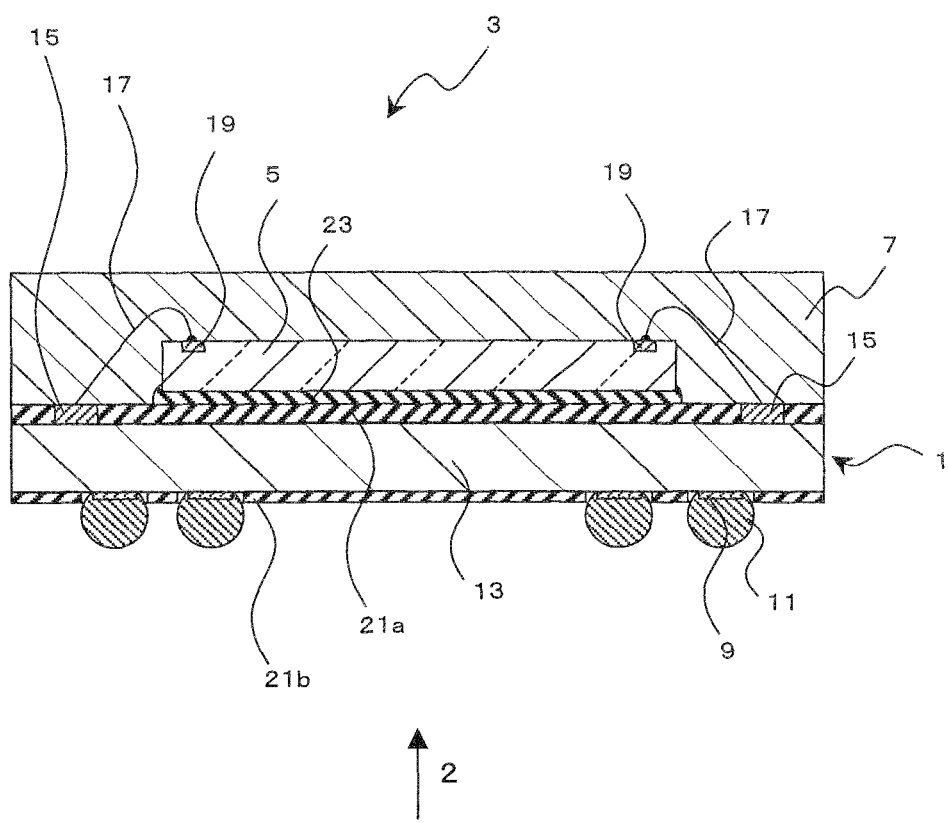
FIG. 1 is a cross-sectional view showing a semiconductor device 3 according to the invention.
Figure 2:
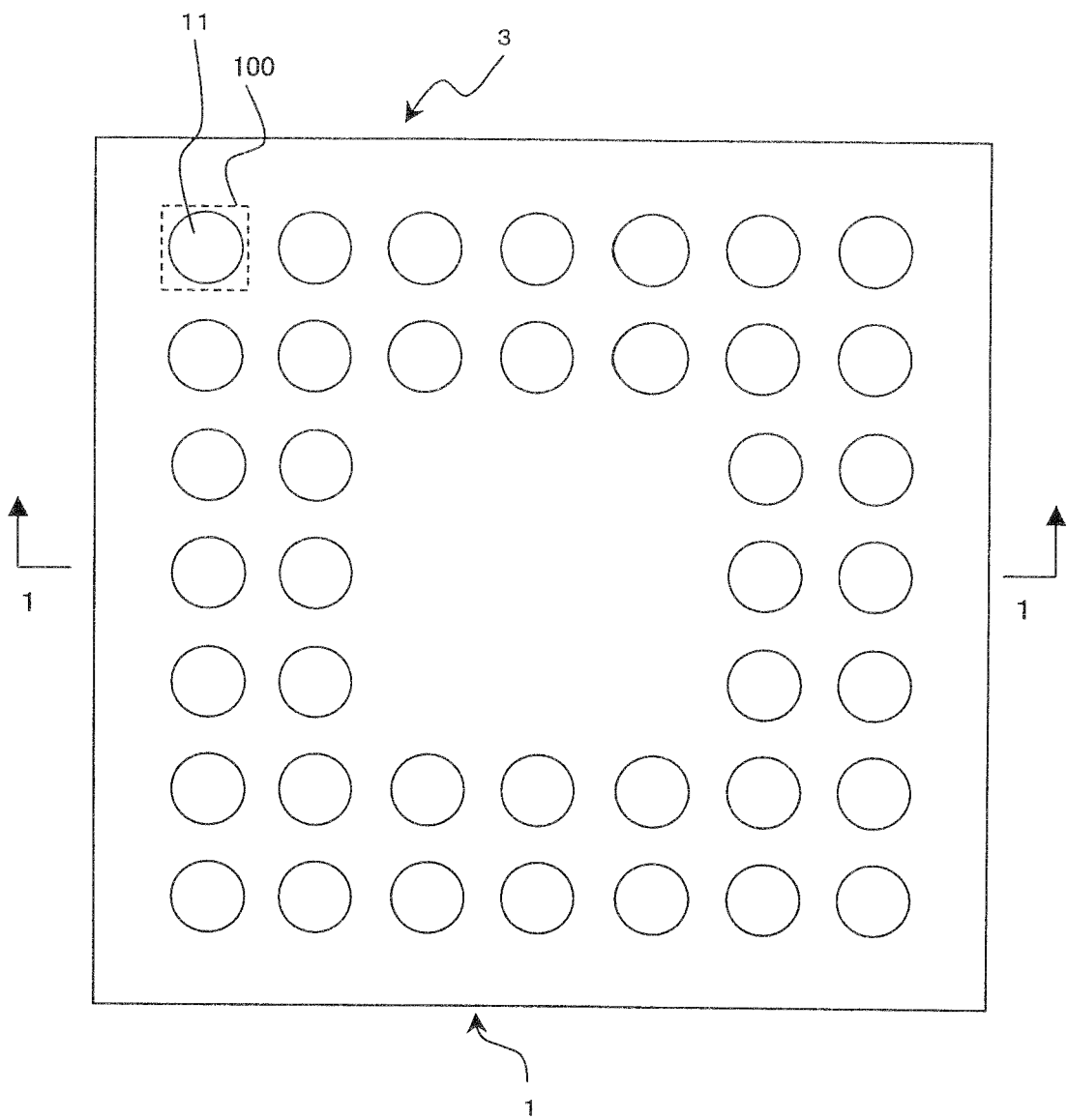
FIG. 2 is a diagram as viewed in the direction of the arrow 2 in FIG. 1.

Referring to FIGS. 1 and 2, description will be made of a wiring board 1 according to a first embodiment of the present invention, and a schematic structure of a semiconductor device 3 comprising the wiring board 1.

As shown in FIGS. 1 and 2, the semiconductor device 3 comprises a plate-like wiring board 1 comprising a substantially rectangular shape in plan view, and a semiconductor chip 5. The shown semiconductor chip 5 is mounted on one face (first face) of the wiring board 1.

The semiconductor chip 5 comprises, on one face of a substrate made of a semiconductor chip material such as silicon or germanium, a logic circuit such as a microprocessor, or a memory circuit such as an SRAM (Static Random Access Memory) or a DRAM (Dynamic Random Access Memory).

Solder balls 11 are mounted on the other face (second face) of the wiring board 1 to serve as contact members for connecting the semiconductor device 3 with another device.

Figure 3:
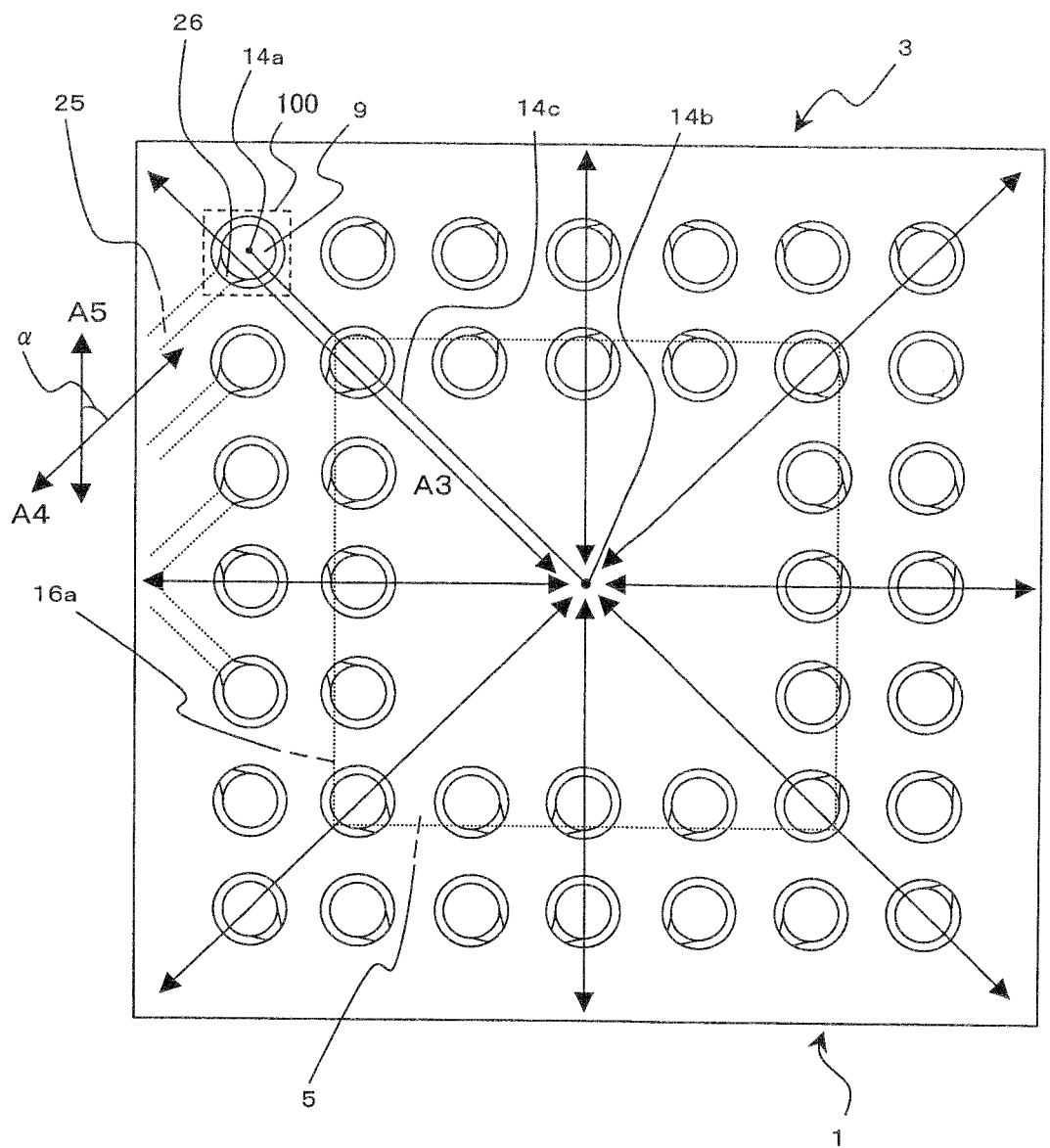
FIG. 3 is a diagram similar to FIG. 2 but omitting solder balls 11.

Referring to FIGS. 1 to 3, the structure of the wiring board 1 and the semiconductor device 3 will be described in more detail.

As shown in FIGS. 1 to 3, the wiring board 1 comprises a substrate 13, a solder resist 21*a* provided on one face (first face) of the substrate 13 on which the semiconductor chip 5 is mounted, a solder resist 21*b* provided on the other face (second face) of the substrate 13, lands 9 provided on the second face of the substrate 13, connection pads 15 provided on the first face of the substrate 13 on which the semiconductor chip 5 is mounted, and wiring lines 25 (not shown in FIGS. 1 and 2) provided within and on the second face of the substrate 13.

More specifically, the substrate 13 of the wiring board 1, comprising a rectangular shape of about 0.25 mm×0.25 mm, is made of a glass epoxy composite or the like, and the connection pads 15 are provided in plurality in the vicinity of the outer periphery on one face of the substrate 13.

The solder resist 21*a* provided on the first face of the substrate 13 on which the semiconductor chip 5 is mounted is arranged in a region except the region where the connection pads 15 are formed.

The semiconductor chip 5 is provided on the solder resist 21*a* with an adhesive 23 made of an insulating material.

A plurality of electrode pads 19 is provided on the surface of the semiconductor chip 5 to be connected to the connection pads 15. The connection pads 15 and the electrode pads 19 are electrically connected to each other via wires 17 made of Au, Cu, Al or the like.

A passivation film (not shown) for protecting the circuit formation face is formed on the surface of the semiconductor chip 5 excluding the regions where the electrode pads 19 are formed.

Further, a sealing portion 7 is provided to cover at least the semiconductor chip 5, the connection pads 15, the electrode pads 19, and the wires 17.

The sealing portion 7 is made of an insulating thermoset resin such as an epoxy resin, and protects the semiconductor chip 5, and electrical connection parts comprising the connection pads 15, the electrode pads 19, and the wires 17.

As shown in FIG. 3, the lands 9 provided on the second face of the substrate 13 are arranged in plurality at predetermined intervals to form a lattice pattern. The lands 9 are electrically connected to the connection pads 15 via wiring lines 25 (not shown in FIGS. 1 and 2) provided in the inside of and on the surface of the substrate 13.

This means that the lands 9 are electrically connected to the electrode pads 19 on the semiconductor chip 5 via the wiring lines 25, connection pads 15, and wires 17.

The solder resist 21*b* is provided on the second face of the substrate 13 so as not to be in contact with the lands 9, as described later. The solder balls 11 functioning as contact members are provided on the respective lands 9.

The solder balls 11 electrically connect the semiconductor chip 5 to another device via the wiring lines 25 by being connected with lands or other connection parts of this other device.

Referring to FIGS. 3 to 5B, description will be made of a configuration around the lands 9 of the wiring board 1.

Figure 4:
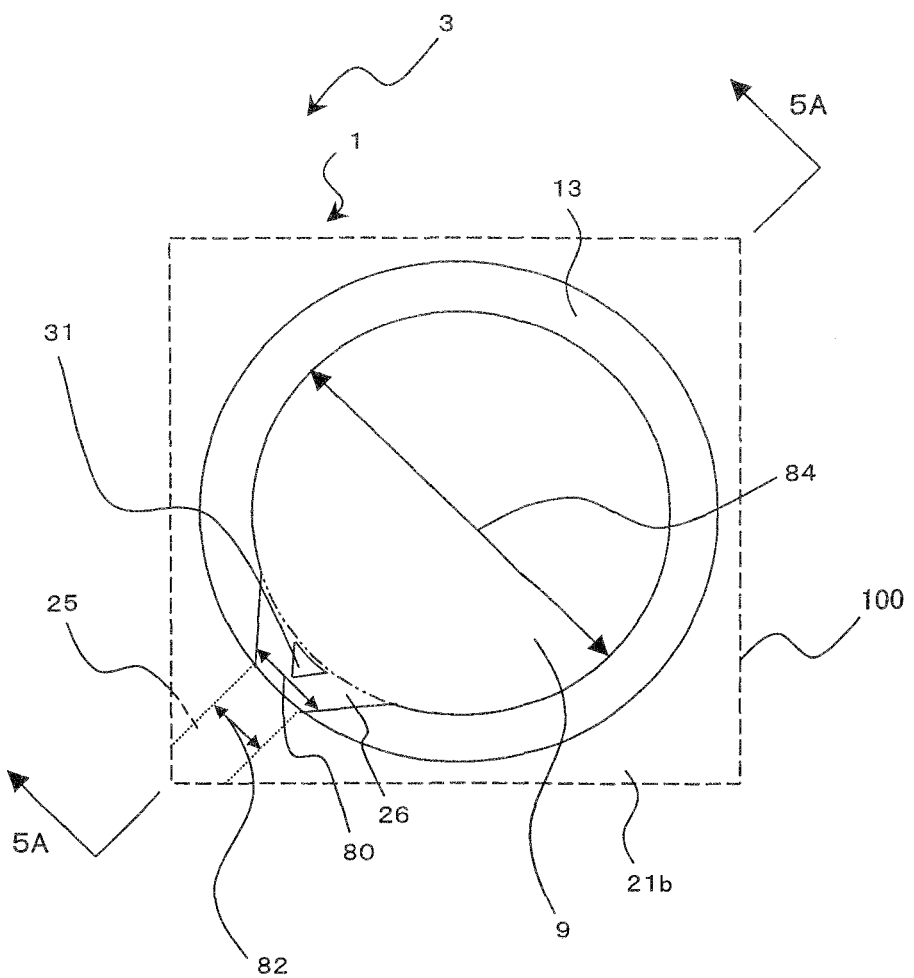
FIG. 4 is an enlarged view of a region 100 in FIG. 3, wherein a part of a wiring line 25 covered with a solder resist 21b is indicated by the dotted lines.

As described later, the lands 9 and the wiring lines 25 are formed by etching a thin film of a conductor such as Cu into a desired pattern. In the first embodiment, the lands 9 are formed in a substantially circular shape, as shown in FIGS. 3 and 4.

The surface of the substrate 13 (see FIG. 1) is mostly covered with the solder resist 21*b*.

Figure 5A:
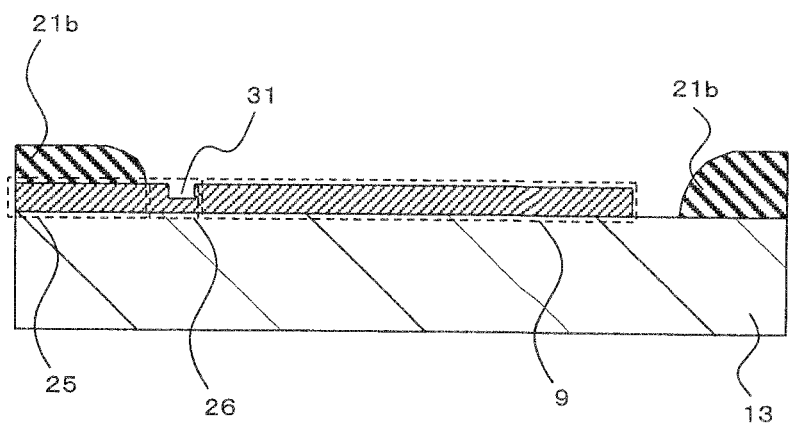
FIG. 5A is a cross-sectional view taken along the line 5A-5A of FIG. 4.

As seen from the cross-sectional view of FIG. 5A showing a region around one of the lands 9, the solder resist 21*b* is not in contact with the land 9, and a so-called NSMD (Non Solder Mask Defined) structure is formed.

As shown in FIGS. 3 to 5B, a connection portion 26 (neck portion) is provided between each wiring line 25 and each land 9 on the surface of the substrate 13 to electrically connect the wiring line 25 and the land 9.

The connection portion 26 is designed such that a width 80 of the connection portion 26 is equal to or greater than a width 82 of the wiring line 25 at its minimum, and equal to or smaller than a width (diameter) 84 of the land 9 at its maximum, and such that the width of the connection portion 26 is gradually increased from the wiring line 25 toward the land 9.

For example, when the width of the wiring line 25 is set to 20 to 40 μm, and the diameter of the land 9 is set to 50 to 100 μm, the connection portion 26 is designed such that the width thereof is increased in the range of 20 to 100 μm.

Thus, the gradually increased width of the connection portion 26 makes it possible to prevent the breakage of the connection portion 26 due to mechanical or thermal shock.

On the other hand, most part of the connection portion 26 is not in contact with the solder resist 21*b* and the surface thereof is exposed.

A recess 31 is formed as a non-flat portion on the exposed surface of the part of the connection portion 26 not in contact with the solder resist 21*b*.

The recess 31 comprises a substantially triangular shape in plan view (cross-sectional view).

Figure 5B:
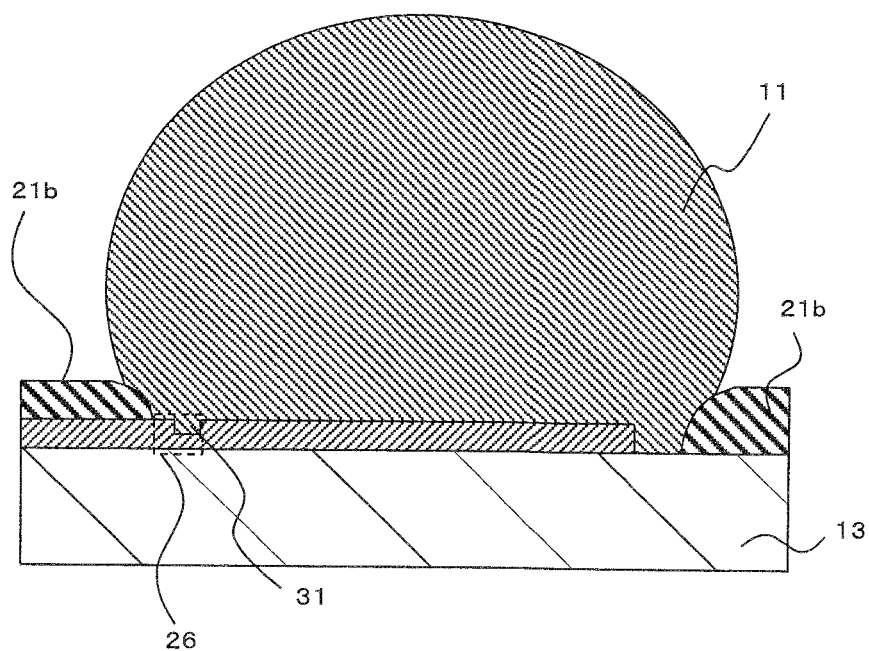
FIG. 5B is a cross-sectional view showing a state in which a solder ball 11 is mounted in FIG. 5A.

When the land 9 is mounted on the solder ball 11, as shown in FIG. 5B, the solder ball 11 is in contact with the connection portion 26 as well, and the recess 31 is filled with the solder.

Since the recess 31 is formed as a non-flat portion in the connection portion 26, the contact area between the connection portion 26 and the solder ball 11 is increased in comparison with when no recess 31 is formed.

Therefore, the connection between the connection portion 26 and the solder ball 11 is enhanced in comparison with when no recess 31 is provided, and hence the solder ball 11 can be prevented from fracture starting from the connection portion 26.

This makes it possible to improve the packaging reliability of the semiconductor device 3.

Further, the structure as described above is not affected by the arrangement of the board wiring and the lands. Therefore, the wiring board according to the first embodiment of the invention is applicable even to a product comprising a wiring board and lands according to a prior art, without changing the arrangement of the board wiring and the lands, but with a slight design alteration.

Although in the first embodiment the three-dimensional shape of the non-flat portion is represented as a recess, the shape of the non-flat portion is not limited to any particular form, and the non-flat portion may be a through hole or protrusion, for example, as long as the contact area is increased in comparison with when no non-flat portion is provided.

Further, as shown in FIG. 3, the connection portion 26 is arranged in a direction other than a direction parallel with a straight line connecting the centers of the land 9 and wiring board 1.

For example, the land 9 in a region 100 of FIG. 3 is arranged such that a connection direction A4 of the connection portion 26 is other than a direction A3 that is parallel with a straight line 14c connecting the center 14a of the land 9 and the center 14b of the wiring board 1.

This is because the semiconductor device 3 is apt to be stressed more in the direction from the center of the land 9 toward the center of the wiring board 1, and the arrangement of the connection portion 26 avoiding such a direction makes it possible to reduce the occurrence of bump fracture starting from the connection portion 26.

Additionally, the connection portion 26 and the wiring line 25 are desirably connected to the land 9 in a direction obliquely inclined to a direction defined by a peripheral edge of the semiconductor chip 5.

For example, in the region 100 of FIG. 3, the connection direction A4 in which the connection portion 26 and wiring line 25 are connected to the land 9 is inclined obliquely relative to a direction A5 defined by an edge 16a of the semiconductor chip 5.

In this case, the angle of inclination a (acute angle) is desirably set to 45 degrees.

The configuration as described above makes it possible to improve the resistance against breakage of wiring lines which may be caused by stress generated by a difference in coefficient of thermal expansion between the semiconductor chip 5 and the wiring board 1 during T/C (Temperature Cycle).

Next, referring to FIGS. 6 to 10, description will be made of processes for manufacturing a semiconductor device 3 comprising the wiring board 1 described above.

The semiconductor device 3 is manufactured by firstly fabricating a wiring motherboard 35 comprising a plurality of wiring boards 1, and then arranging semiconductor chips 5 or the like on the wiring motherboard 35.

Referring to FIGS. 6 to 8C, description will be made of processes for fabricating the wiring motherboard 35.

First, description will be made of a configuration of the wiring motherboard 35 with reference to FIG. 6.

Figure 6:
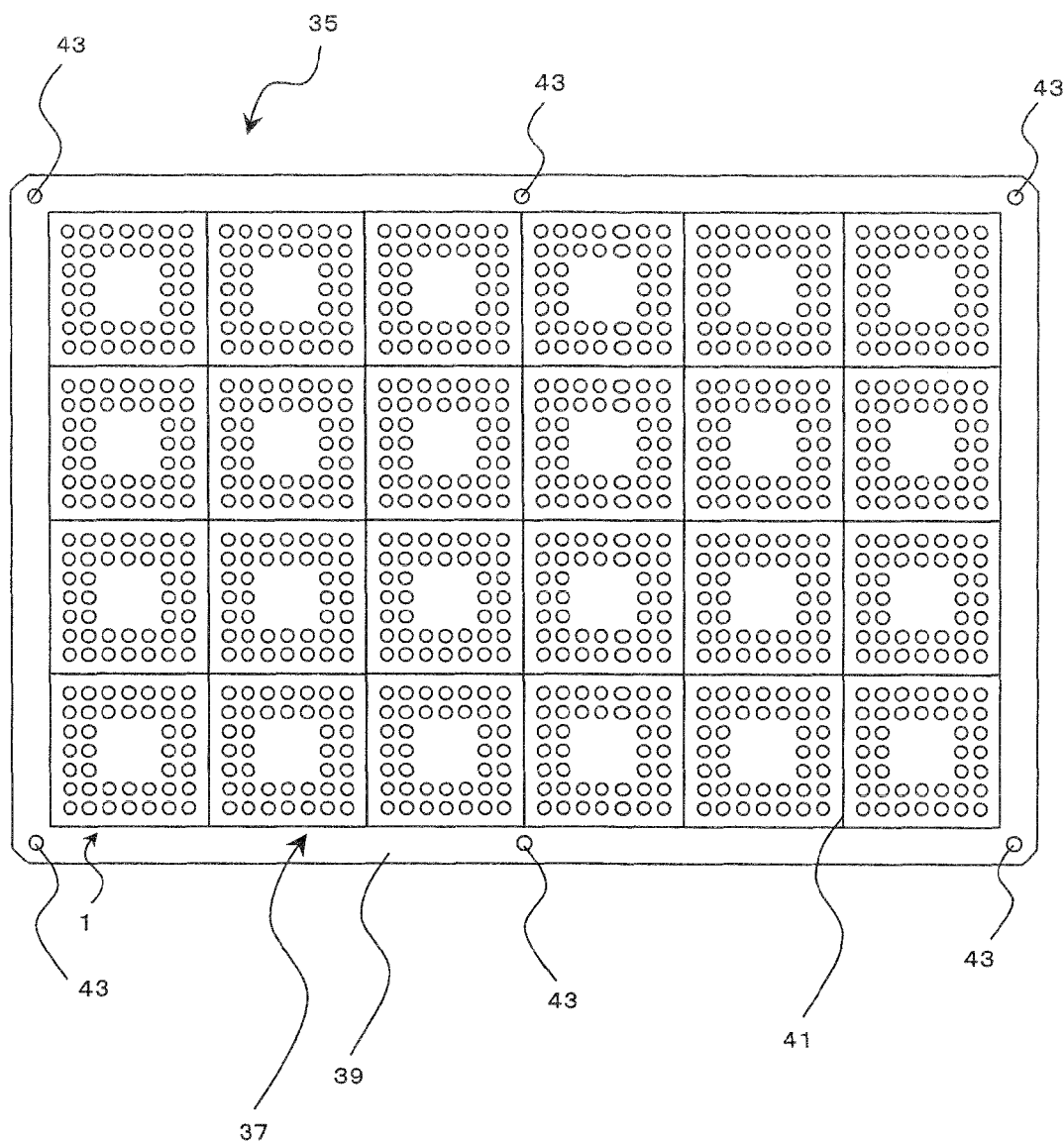
FIG. 6 is a plan view showing a wiring motherboard 35.

As shown in FIG. 6, the wiring motherboard 35 comprises a plurality of rectangular product formation areas 37.

The product formation areas 37 are arranged in matrix, and dicing lines 41 are formed between the product formation areas 37 so that the wiring motherboard 35 can be cut out along these lines.

The wiring boards 1 are each formed by performing predetermined processes (formation of the lands 9 and solder resist 21b, etc) on the product formation area 37 as described later.

A frame 39 is formed around the product formation areas 37, so that this frame 39 is brought into contact with a conveyance device when the wiring motherboard 35 is transported.

The formation of the frame 39 makes it possible to transport the wiring motherboard 35 without the product formation areas 37 being directly touched.

The frame 39 is provided with a plurality of positioning holes 43 which are used for positioning during transportation.

Description will next be made of processes for fabricating the wiring motherboard 35 with reference to FIGS. 7A to 8C.

Figure 7A:
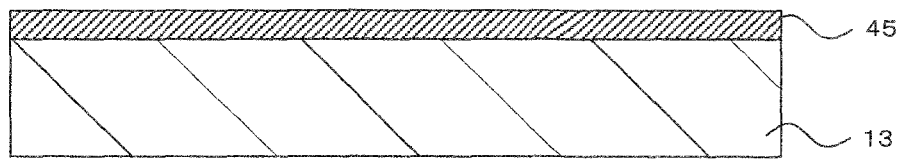
FIG. 7A is a diagram showing a process for manufacturing a wiring motherboard 35.

A substrate 13 made of a glass epoxy composite or the like is prepared and, as shown in FIG. 7A, a copper layer 45 for formation of lands 9, connection portions 26, and wiring lines 25 is pasted on the substrate 13.

Figure 7B:
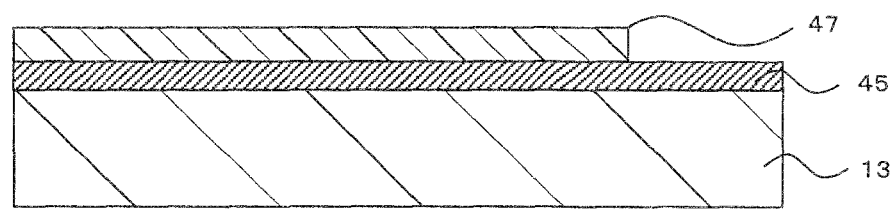
FIG. 7B is a diagram showing a process for manufacturing the wiring motherboard 35.

A photo resist 47 serving as a resist film is applied on the surface of the copper layer 45, and then the applied photo resist 47 is patterned as shown in FIG. 7B such that the photo resist 47 is removed, except for the regions where the lands 9, the wiring lines 25, and the connection portions 26 are to be formed, to expose the copper layer 45.

Figure 7C:
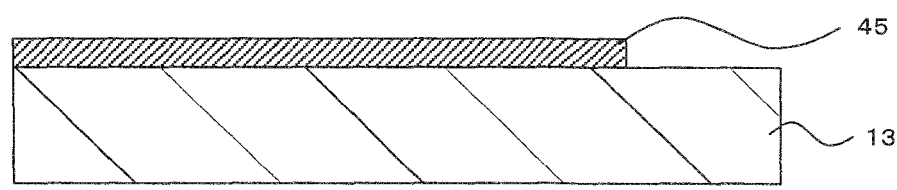
FIG. 7C is a diagram showing a process for manufacturing the wiring motherboard 35.

Further, the exposed part of the copper layer 45 is partially etched away, as shown in FIG. 7C, to form the lands 9, connection portions 26, and the wiring lines 25.

Figure 7D:
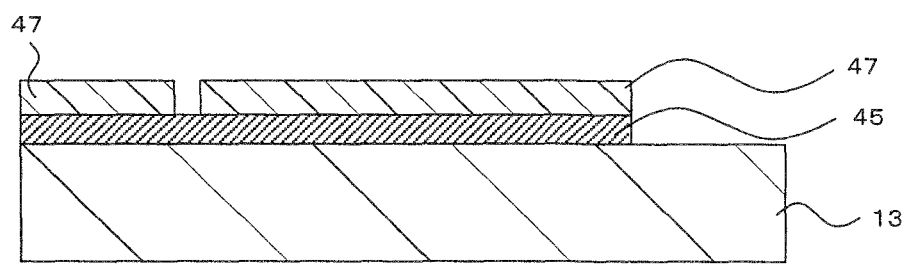
FIG. 7D is a diagram showing a process for manufacturing the wiring motherboard 35.

The photo resist 47 is again applied on the copper layer 45, and patterned into a desired shape while leaving the part of the photo resist 47 where the recesses 31 are to be formed, as shown in FIG. 7D.

Figure 8A:
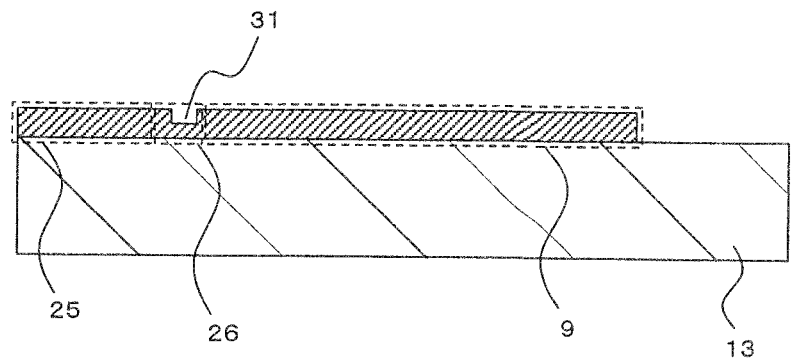
FIG. 8A is a diagram showing a process for manufacturing the wiring motherboard 35.

Next, as shown in FIG. 8A, the copper layer 45 is selectively etched away to form the recesses 31, and then the remaining photo resist 47 is removed.

During this process, the depth of the recesses 31 is controlled by controlling the duration of etching or the like.

By the processes described above, the wiring lines 25, lands 9 and connection portions 26 are formed on the substrate 13, and the recesses 31 are formed on the connection portions 26, as shown in FIG. 8A.

Figure 8B:
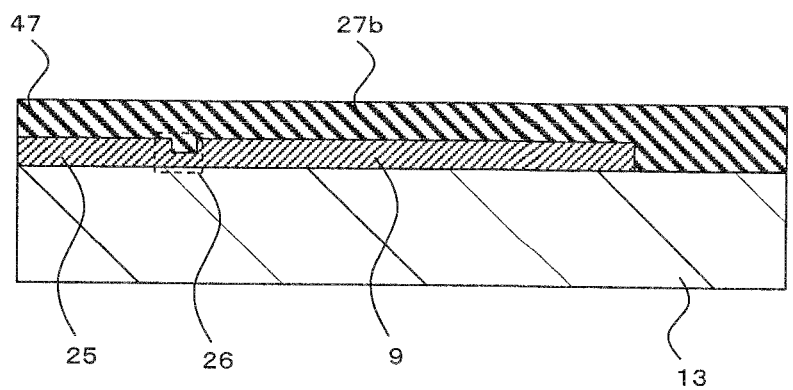
FIG. 8B is a diagram showing a process for manufacturing the wiring motherboard 35.

Then, an ultraviolet curing solder resist 21b is applied all over the substrate 13, the wiring lines 25, the lands 9 and the connection portions 26 as shown in FIG. 8B.

After completing the application of the solder resist 21b, only the part of the solder resist 21b to be left is caused to cure by being irradiated with ultraviolet rays.

The solder resist 21b is not in contact with the connection portions 26 or the lands 9.

Therefore, no ultraviolet rays are applied to the peripheries of the connection portions 26 and lands 9.

After being irradiated with ultraviolet rays, the substrate 13 and the lands 9 are entirely cleaned to remove the uncured part of the solder resist 21b. As a result, a structure as shown in FIG. 8C is obtained.

Figure 8C:
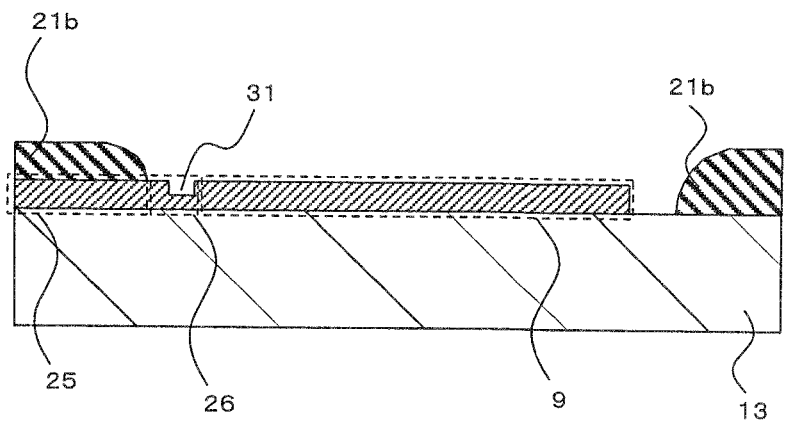
FIG. 8C is a diagram showing a process for manufacturing the wiring motherboard 35.

As shown in FIG. 8C, the solder resist 21b is not in contact with the lands 9, and (at least a part of) the connection portions 26 are not in contact with the solder resist 21b, either.

Therefore, each of the lands thus formed assumes a perfect NSMD (Non Solder Mask Defined) structure, except for its part connected with the connection portion 26.

In addition, selective etching is performed using the patterns of the photoresist 47, whereby the connection portion 26 is formed to comprise a width which is equal to or greater than that of the wiring line 25 and equal to or smaller than that of the land 9, the width of the connection portion 26 being gradually increased from the wiring line 25 toward the land 9.

Further, selective etching is performed using the patterns of the photoresist 47, whereby the connection portion 26 is formed to connect between the land 9 and the wiring line 25 in a direction other than the direction of a straight line connecting the center of the land 9 and the center of the substrate 13, or to connect between the land 9 and the wiring line 25 in a direction obliquely inclined relative to a direction defined by a peripheral edge of a semiconductor chip 5 when the semiconductor chip 5 is arranged.

Subsequently, if required, a solder resist 21a and connection pads 15 as shown in FIG. 1 are formed on the opposite face of the substrate 13, while wiring lines 25 are provided within the substrate 13 to connect between the connection pads 15 and the lands 9, and thus the wiring motherboard 35 is completed.

The surfaces of the lands 9 and the connection pads 15 are plated, if required, so that the plated layer provides anti-oxidation and barrier effects.

Referring to FIGS. 9A to 10B, description will be made of processes for manufacturing a semiconductor device 3 by arranging semiconductor chips 5 on the wiring motherboard 35.

Figure 9A:
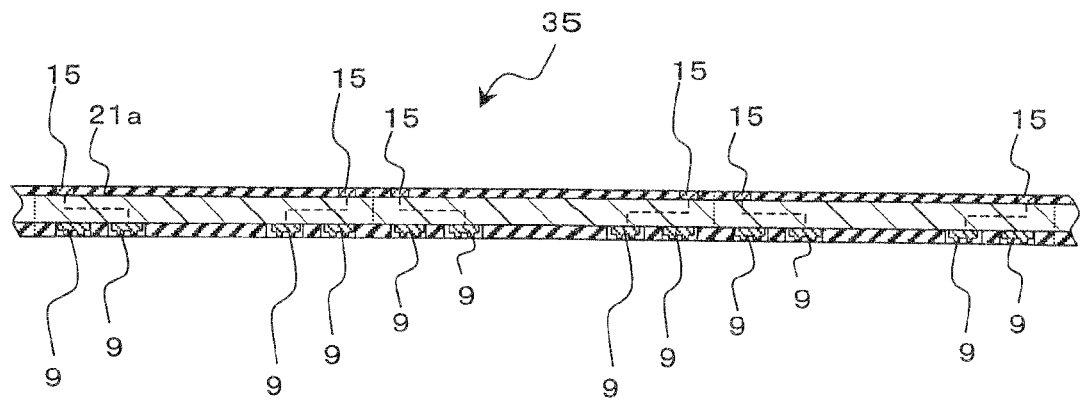
FIG. 9A is a diagram showing a process for manufacturing a semiconductor device 3 using the wiring motherboard 35.

First, as shown in FIG. 9A, the wiring motherboard 35 is placed on a chip mounter (not shown) with the connection pads 15 facing up.

Figure 9B:
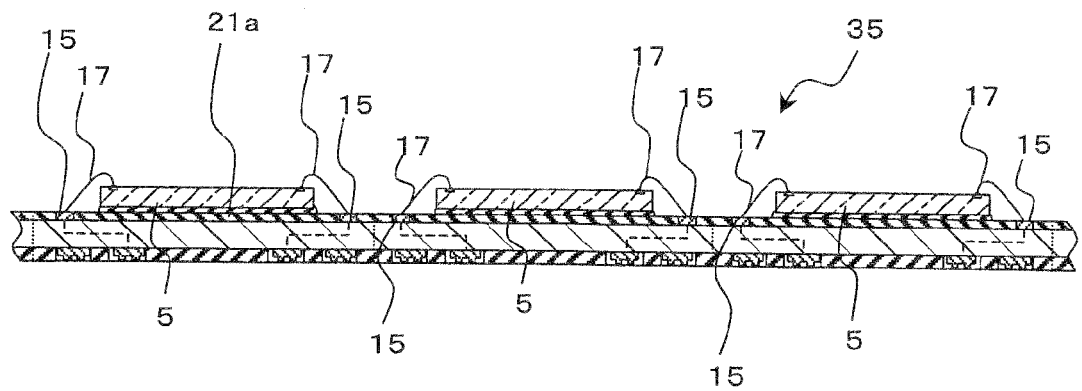
FIG. 9B is a diagram showing a process for manufacturing the semiconductor device 3 using the wiring motherboard 35.

Upon completion of the placement of the wiring motherboard 35, as shown in FIG. 9B, semiconductor chips 5 are mounted on the wiring motherboard 35 by means of an adhesive 23 by the chip mounter (not shown). The adhesive 23 is then cured by application of heat, whereby the chip mounting is completed.

Upon completion of the mounting of the semiconductor chips 5, the wiring motherboard 35 is mounted on a wire bonder (not shown).

Upon completion of the mounting of the wiring motherboard 35, the wire bonder connects an end of a wire 17 to an electrode pad 19 (see FIG. 1) by ultrasonic thermocompression, and then connects the other end of the wire onto the connection pad 15 by ultrasonic thermocompression such that the wire forms a predetermined loop shape.

Subsequently, the wiring motherboard 35 comprising the semiconductor chips 5 mounted thereon is placed on a mold machine (not shown).

Upon completion of the placement of the wiring motherboard 35, the wiring motherboard 35 is clamped between the upper and lower molds of the mold machine (not shown). In this clamped state, a molten sealing resin such as thermosetting epoxy resin is injected between the upper and lower molds and cured.

Figure 9C:
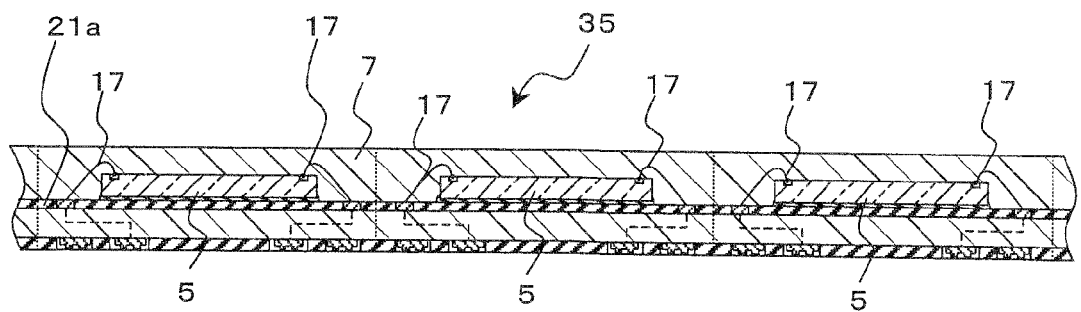
FIG. 9C is a diagram showing a process for manufacturing the semiconductor device 3 using the wiring motherboard 35.

Thus, the sealing resin is thermally cured and, as shown in FIG. 9C, a sealing portion 7 collectively covering a plurality of product formation areas 37 (see FIG. 6) is formed. The use of the collective molding enables efficient formation of the sealing portion 7.

Subsequently, the wiring motherboard 35 is placed on a bail mounter (not shown) with the lands 9 facing up.

Figure 10A:
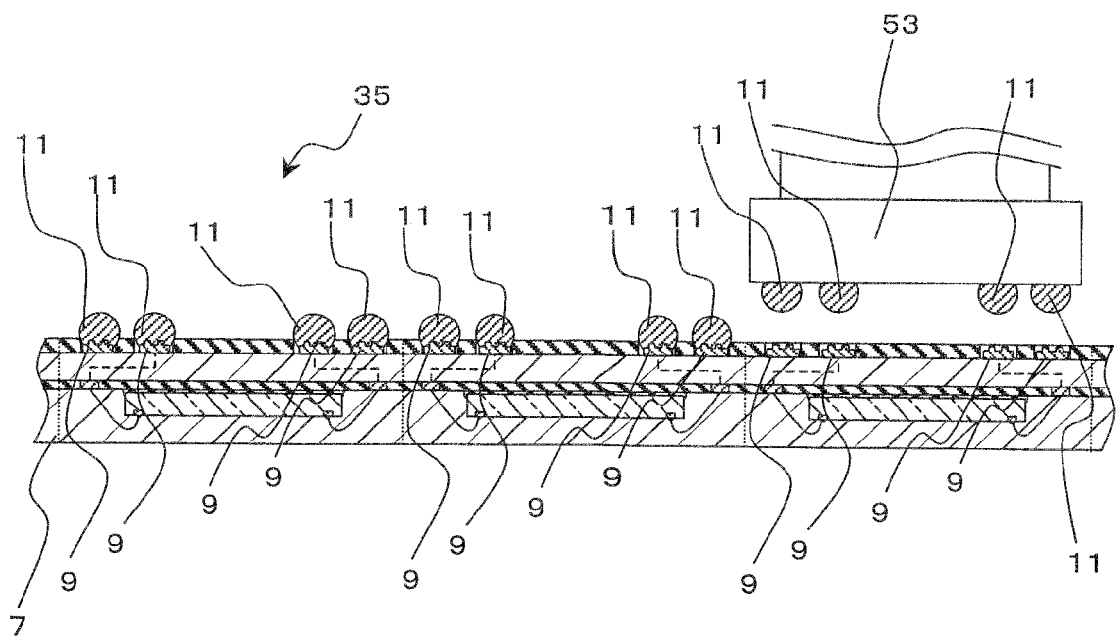
FIG. 10A is a diagram showing a process for manufacturing the semiconductor device 3 using the wiring motherboard 35.

Upon completion of the placement of the wiring motherboard 35, as shown in FIG. 10A, solder balls 11 are vacuum-held by a mount tool 53 of the ball mounter, for example, and mounted on the respective lands 9 with flux interposed therebetween.

Subsequently, reflow is performed on the wiring motherboard 35, whereby the solder balls 11 are connected with the lands 9 and wiring lines 25.

This means that the wiring lines 25 are each connected to the solder ball 11 via the land 9 and the connection portion 26.

In this manner, external terminals (contact members) are formed by the mounting of the solder balls 11 on the lands 9 of the wiring motherboard 35.

The wiring motherboard 35 is then placed on a dicing machine (not shown).

Figure 10B:
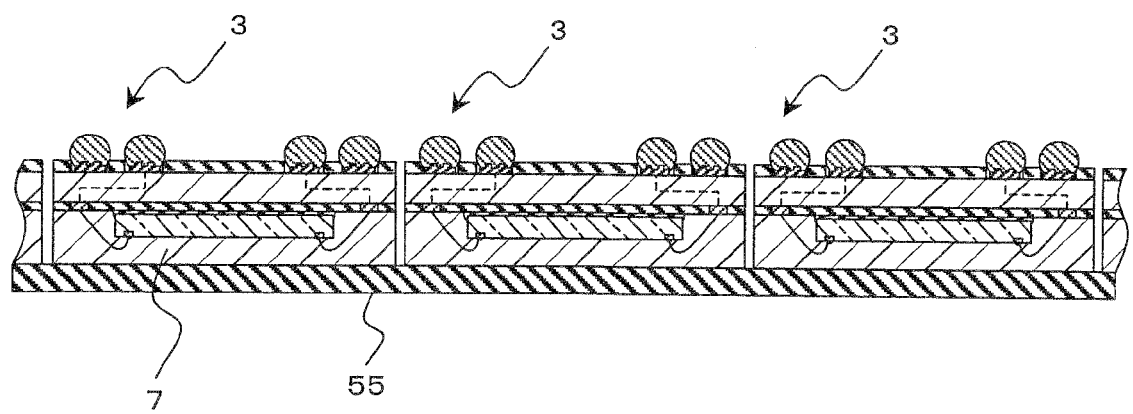
FIG. 10B is a diagram showing a process for manufacturing the semiconductor device 3 using the wiring motherboard 35.

More specifically, as shown in FIG. 10B, the sealing portion 7 is fixedly pasted to a dicing tape 55.

Subsequently, the fixedly pasted wiring motherboard 35 is cut along the dicing lines 41 (see FIG. 6) and separated into individual product formation areas 37 (see FIG. 6) by means of a rotary dicing blade (not shown).

Finally, each of the separated individual product formation areas 37 is picked up from the dicing tape 55, whereby a semiconductor device 3 as shown in FIG. 1 can be obtained.

According to the first embodiment, as described above, the wiring board 1 of the semiconductor device 3 comprises the substrate 13, the solder resist 21b, the wiring lines 25, the connection portions 26 and the lands 9, and each of the connection portions 26 is provided with a recess 31 as a nonflat portion.

As a result, the contact area between the connection portion 26 and the solder ball 11 is increased in comparison with the prior art, and hence the bond strength between the connection portion 26 and the solder ball 11 can be enhanced.

This makes it possible to prevent the fracture of the solder ball 11 starting from the connection portion 26.

Further, the connection portion 26 is designed to comprise a width 80 which is, at its minimum, equal to or greater than the width 82 of the wiring line 25 and, at its maximum, equal to or smaller than the width (diameter) 84 of the land 9, and such that the width is gradually increased from the wiring line 25 toward the land 9. Specifically, for example, when the width of the wiring line 25 is set to 20 to 40 μm, and the diameter of the land 9 is set to 50 to 100 μm, the connection portion 26 is formed to comprise a width which is gradually increased in the range of 20 to 100 μm.

Thus, the gradually increased width of the connection portion 26 makes it possible to prevent the breakage of the connection portion 26 caused by mechanical shock or thermal shock.

As a result, the packaging reliability of the semiconductor device 3 can be improved.

Further, according to the first embodiment, the structure as described above is not affected by the arrangement of the board wiring and the lands. Therefore, the wiring board of the invention is applicable to products comprising conventional wiring board and land arrangement, without changing the arrangement of the board wiring and the lands, but with a slight design alteration.

Further, according to the first embodiment, the connection portion 26 is arranged such that the connection direction thereof is other than a direction parallel with a straight line connecting the centers of the land 9 and wiring board 1.

This makes it possible to reduce the occurrence of bump fracture starting from the connection portion 26.

Further, according to the first embodiment, the direction of connecting the connection portion 26 and wiring line 25 to the land 9 is obliquely inclined relative to a direction defined by an edge of the semiconductor chip 5.

This makes it possible to improve the resistance against breakage of wiring lines caused by stress generated by a difference in coefficient of thermal expansion between the semiconductor chip 5 and the wiring board 1 during T/C (Temperature Cycle).

Next, an electronic device 101 according to a second embodiment of the invention will be described with reference to FIG. 11.

The electronic device 101 according to the second embodiment is obtained by mounting the semiconductor device 3 according to the first embodiment on a motherboard 65.

In the description of the second embodiment below, elements comprising the same functions as those of the first embodiment are assigned with the same reference numerals and description thereof is omitted.

Figure 11:
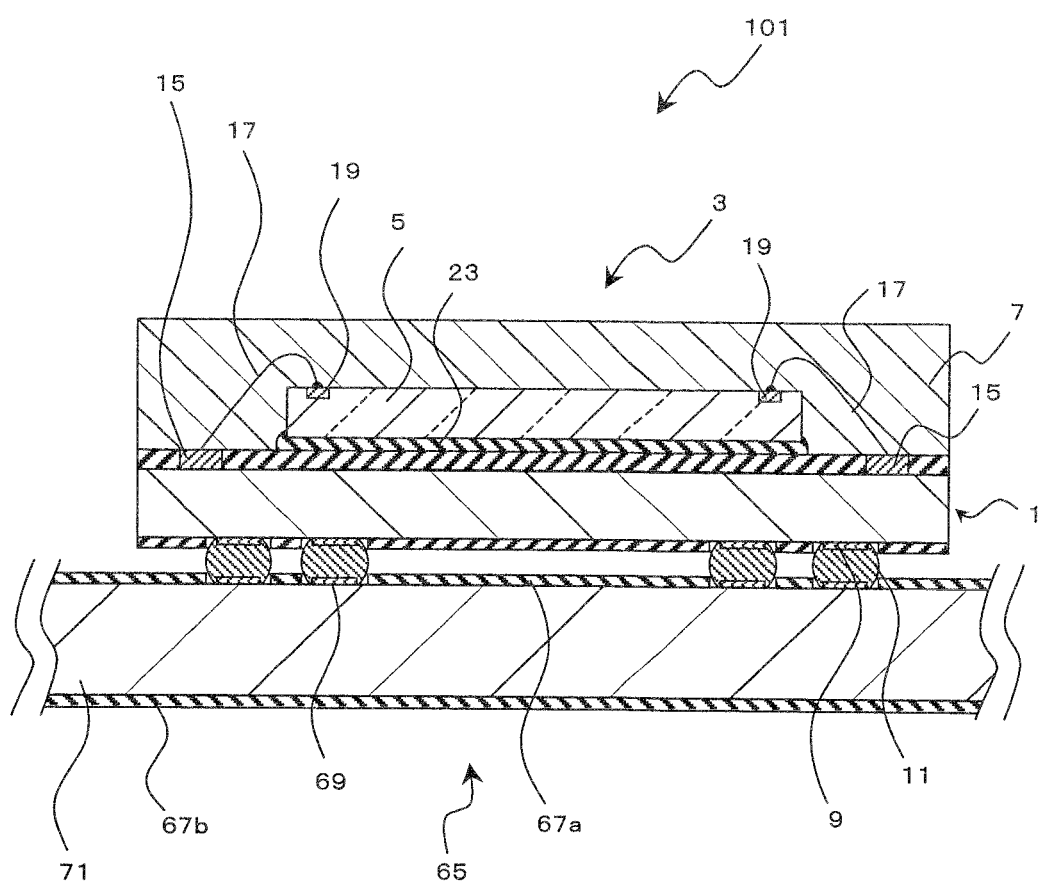
FIG. 11 is a cross-sectional view showing an electronic device 101.

As shown in FIG. 11, the electronic device 101 comprises a motherboard 65 and a semiconductor device 3.

The motherboard 65 comprises a substrate 71 made of a glass epoxy composite or the like, and a plurality of lands 69 are arranged at predetermined intervals to form a lattice pattern on one face (first face) of the substrate 71.

In addition, there are provided, on the first face of the substrate 71, wiring lines (not shown) and connection portions (not shown) connecting between the wiring lines 70 and lands 69.

Further, a solder resist 67a is provided on the first face of the substrate 71 except the lands 69 and the connection portions, while a solder resist 67b is provided on the other face (second face) of the substrate 71.

The configuration of the solder resist 67a, the lands 69 and the connection portions is the same as that of the solder resist 21b, the wiring lines 25, the lands 9 and the connection portions 26 on the wiring board 1 of the semiconductor device 3 (see FIGS. 3 and 4).

In other words, the solder resist 67a is not in contact with the lands 69, forming a so-called NSMD (Non Solder Mask Defined) structure.

On the other hand, a recess (not shown) as a non-flat portion is provided in the connection portion.

As shown in FIG. 11, the semiconductor device 3 is mounted on the motherboard 65 and the solder balls 11 are disposed on the respective lands 69. Thus, each of the solder balls 11 covers the connection portion and the land 69, whereby the wiring line and the solder ball 11 are electrically connected to each other via the land 69 and the connection portion.

Since the connection portion comprises the recess 74, the contact area between the connection portion and the solder ball 11 is increased in comparison with when no recess 74 is provided.

This configuration enhances the connection between the connection portion and the solder ball 11 in the motherboard 65 as well, and hence makes it possible to prevent the fracture of the solder ball 11 starting from the connection portion. Thus, an ideal bond strength can be expected.

The connection portion comprises a width that is equal to or greater than that of the wiring line and equal to or smaller than that of the land 69. Further, the connection portion is formed such that the width thereof is gradually increased from the wiring line toward the land 69.

Further, the connection portion is formed such that the land 69 and the wiring line are connected to each other in a direction other than the direction of a straight line connecting the center of the land 69 and the center of the motherboard 65, or such that the land 69 and the wiring line are connected to each other in a direction obliquely inclined relative to a direction defined by a peripheral edge of the motherboard 65.

According to the second embodiment, as described above, the electronic device 101 comprises the motherboard 65 and the semiconductor device 3, and the motherboard 65 also comprises the characteristics according to the first embodiment. This means that the second embodiment provides beneficial effects equaling or surpassing those of the first embodiment.

Next, a wiring board 1a according a third embodiment will be described with reference to FIGS. 12A and 12B.

The wiring board 1a according to the third embodiment is different from the first embodiment in that the recess 31a of the connection portion 26a is formed in a polygonal shape (pentagonal shape), while the polygonal shape comprises interior angles $\beta 1$, $\beta 2$, $\beta 3$, $\beta 4$, and $\beta 5$ of 90 degrees or greater.

In the description of the third embodiment, elements comprising the same functions as those of the first embodiment are assigned with the same reference numerals and description thereof is omitted.

Figure 12A:
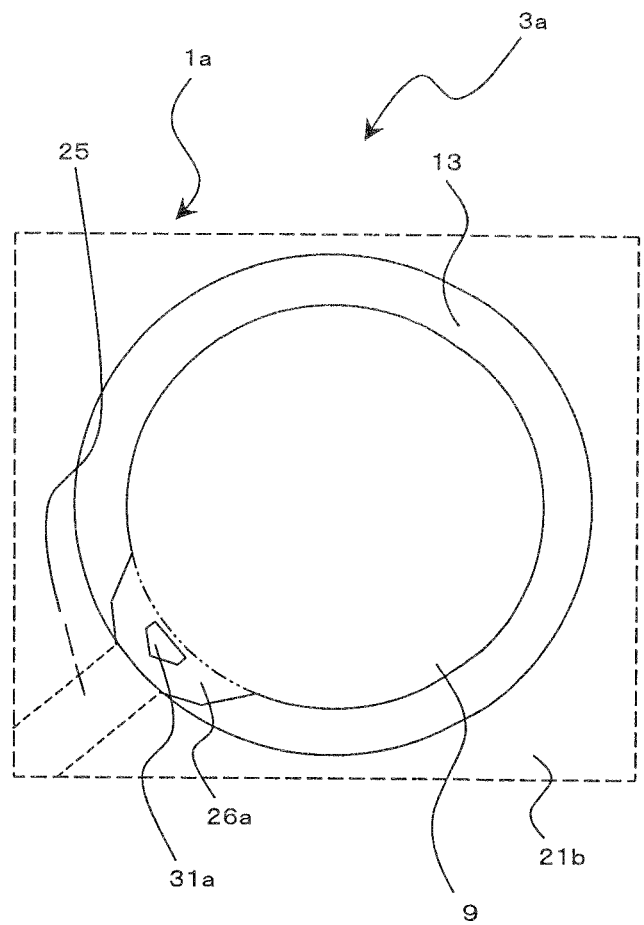
FIG. 12A is a plan view showing a wiring board 1a, wherein illustration of a solder ball 11 is omitted and a part of a wiring line 25 covered with a solder resist 21b is indicated by the dotted lines.
Figure 12B:
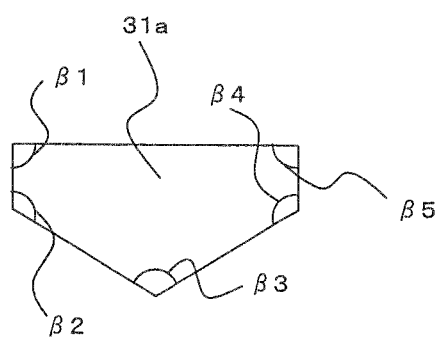
FIG. 12B is an enlarged view showing the recess 31a in FIG. 12A.

As shown in FIGS. 12A and 12B, the recess 31a of the connection portion 26a comprises a pentagonal shape in plan view (cross-sectional view).

The planar shape of the recess 31a comprises interior angles $\beta 1$, $\beta 2$, $\beta 3$, $\beta 4$, and $\beta 5$ all of which are 90 degrees or greater.

According to this configuration, the solder is allowed to enter the inside of the recess 31a more easily when the solder ball 11 is disposed on the land.

This further enhances the connection between the connection portion 26a and the solder ball 11.

The planar shape of the recess 31a is not limited to the pentagonal shape, but may be other polygonal shape with six or more angles.

According to the third embodiment as described above, the wiring board 1a of the semiconductor device 3a comprises a substrate 13, a solder resist 21b, wiring lines 25, connection portions 26a, and lands 9, while each of the connection portions is formed with a recess 31a as a non-flat portion.

Accordingly, the third embodiment provides beneficial effects equivalent to those of the first embodiment.

Further, according to the third embodiment, the recess 31a of the connection portion 26a comprises a polygonal (pentagonal) shape in plan view (cross-sectional view), and the polygonal shape comprises interior angle $\beta 1$, $\beta 2$, $\beta 3$, $\beta 4$, and $\beta 5$ of 90 degrees or greater.

Therefore, when the solder ball 11 is disposed on the land, the solder is allowed to enter the inside of the recess 31a more easily and hence the connected between the connection portion 26a and the solder ball 11 is further enhanced in comparison with the first embodiment.

Next, a wiring board 1b according to a fourth embodiment will be described with reference to FIG. 13.

The wiring board 1b according to the fourth embodiment is different from the first embodiment in that the recess 31b is extended from the connection portion 26b toward the land 9.

In the description of the fourth embodiment below, elements comprising the same functions as those of the first embodiment are assigned with the same reference numerals and description thereof is omitted.

Figure 13:
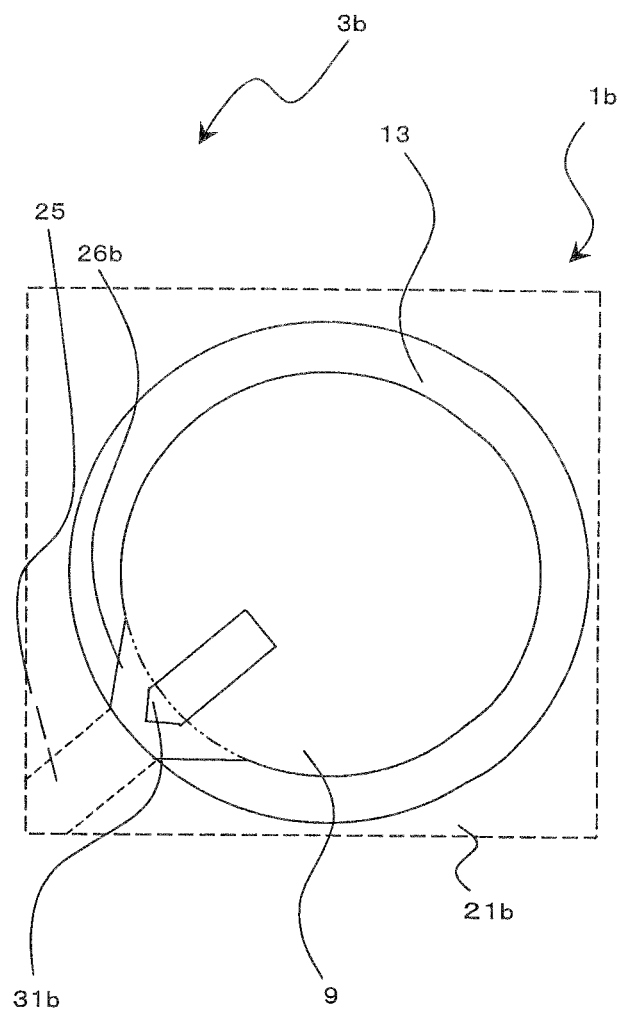
FIG. 13 is a plan view showing a wiring board 1b, wherein illustration of a solder ball 11 is omitted and a part of a wiring line 25 covered with a solder resist 21b is indicated by the dotted lines.

As shown in FIG. 13, the recess 31b is extended from the connection portion 26b toward the land 9.

This means that the recess 31b is not only arranged in the connection portion 26b but also arranged to extend into the land 9.

According to this configuration, the contact area between the solder ball 11 and the land 9 can be increased in comparison with when the recess is provided only in the connection portion 26b.

According to the fourth embodiment as described above, the wiring board 1b of the semiconductor device 3b comprises a substrate 13, a solder resist 21b, wiring lines 25, connection portions 26b, and lands 9, and a recess 31b is provided as a non-flat portion in each of the connection portion 26b.

As a result, the fourth embodiment provides beneficial effects equivalent to those of the first embodiment.

According to the fourth embodiment, the recess 31b of the connection portion 26b is extended from the connection portion 26b toward the land 9.

Therefore, the contact area between the solder ball 11 and the land 9 can be increased in comparison with the first embodiment, and hence the bond strength thereof can be enhanced.

Next, a wiring board 1c according to a fifth embodiment will be described with reference to FIG. 14.

The wiring board 1c according to the fifth embodiment is different from the second embodiment in that a plurality of recesses is provided in a connection portion 26c.

In the description of the fifth embodiment below, elements comprising the same functions as those of the first embodiment are assigned with the same reference numerals and description thereof is omitted.

Figure 14:
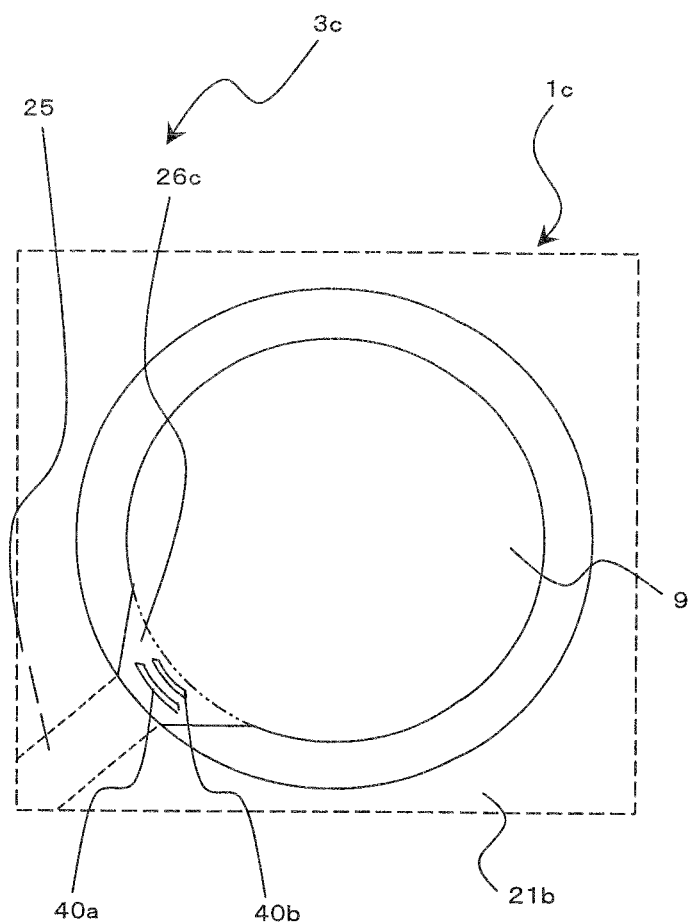
FIG. 14 is a plan view showing a wiring board 1c, wherein illustration of a solder ball 11 is omitted and a part of a wiring line 25 covered with a solder resist 21b is indicated by the dotted lines.

As shown in FIG. 14, a plurality of recesses 40a and 40b are provided in a connection portion 26c.

Thus, the recesses are provided at a plurality of positions on the connection portion 26c, whereby the contact area with the solder ball 11 can be made greater and the bond strength can be enhanced in comparison with the case in which a single recess is provided.

The width of the connection portion 26c and the shape of the recesses in the connection portion 26c may be varied variously.

According to the fifth embodiment as described above, the wiring board 1d of the semiconductor device 3c comprises a substrate 13, a solder resist 21b, wiring lines 25, connection portions 26c, and lands 9, while the connections portions 26c are each formed with recesses 40a and 40b as non-flat portions.

Consequently, the fifth embodiment provides beneficial effects equivalent to those of the first embodiment.

Further, according to the fifth embodiment, a plurality of recesses are provided in the connection portion 26c.

This means that the contact area with the solder ball 11 can be further increased in comparison with the first embodiment.

Next, a wiring board 1d according to a sixth embodiment will be described with reference to FIG. 15.

The wiring board 1d according to the sixth embodiment is different from the second embodiment in that the shape of the connection portion 26d is a quadrangular shape.

In the description of the sixth embodiment below, elements comprising the same functions as those of the first embodiment are assigned with the same reference numerals and description thereof is omitted.

Figure 15:
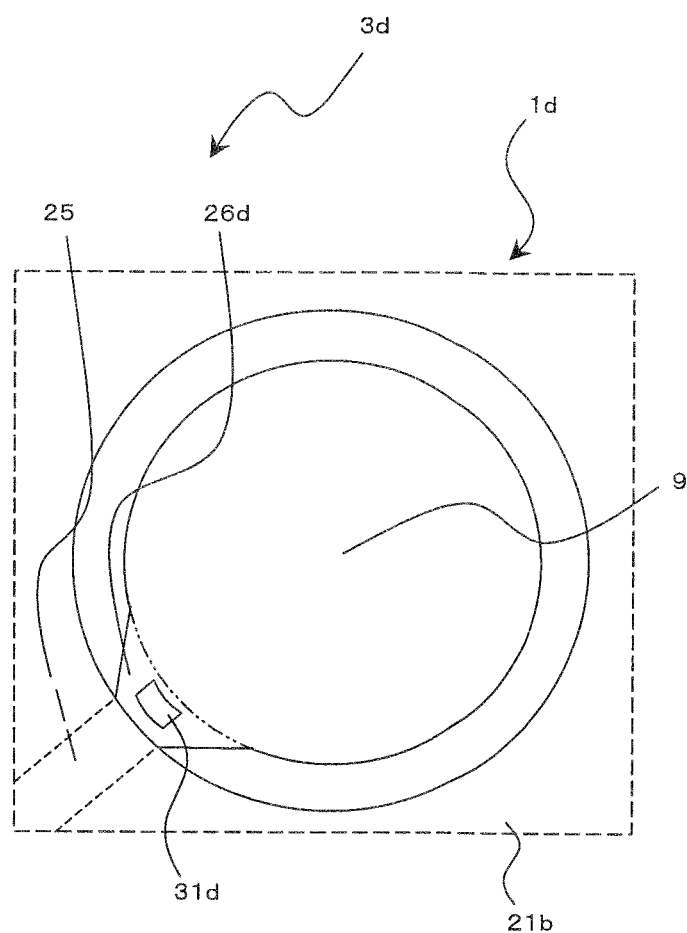
FIG. 15 is a plan view showing a wiring board 1d, wherein illustration of a solder ball 11 is omitted and a part of a wiring line 25 covered with a solder resist 21b is indicated by the dotted lines.

In the wiring board 1d as shown in FIG. 15, the recess 31d of the connection portion 26d comprises a substantially quadrangular shape in plan view (cross-sectional view).

In this manner, the planar shape of the recess 31d may be quadrangular. The planar shape of the recess may be varied variously.

According to the sixth embodiment as described above, the wiring board 1d of the semiconductor device 3d comprises a substrate 13, a solder resist 21b, wiring lines 25, connection portions 26d and lands 9, while each of the connection portions 26d is formed with a recess 31d as a non-flat portion.

As a result, the sixth embodiment provides beneficial effects equaling or surpassing those of the first embodiment by optimizing the contact area with the solder ball 11 through adjustment of the size and shape of the recess 31d.

Thus, the sixth embodiment provides beneficial effects equivalent to those of the first embodiment.

Next, a wiring board 1e according to a seventh embodiment will be described with reference to FIG. 16.

The wiring board 1e according to the seventh embodiment is different from the first embodiment in that the land 9e comprises a quadrangular shape in plan view.

In the description of the seventh embodiment below, elements comprising the same functions as those of the first embodiment are assigned with the same reference numerals and description thereof is omitted.

Figure 16:
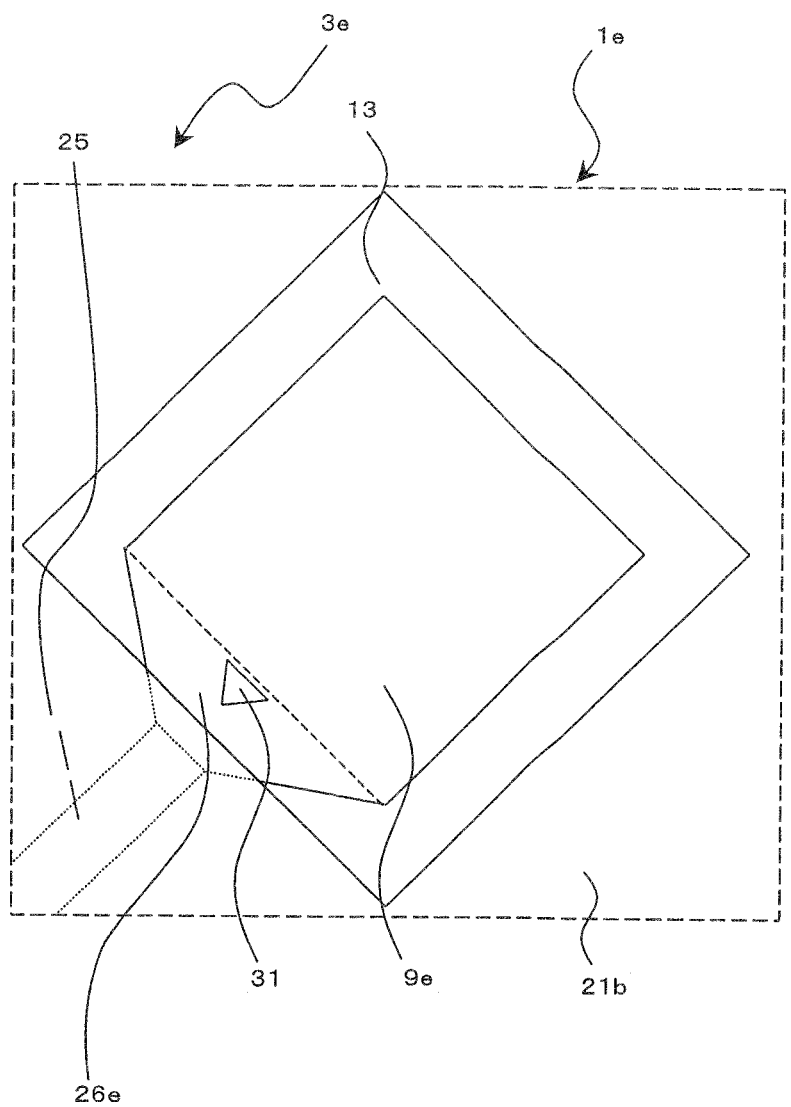
FIG. 16 is a plan view showing a wiring board 1e, wherein illustration of a solder ball 11 is omitted and a part of a wiring line 25 covered with a solder resist 21b is indicated by the dotted lines.

As shown in FIG. 16, the land 9e of the wiring board 1e comprises a quadrangular shape in plan view.

In this manner, the planar shape of the land is not limited to a circular shape, and the land may be formed in any other shape as long as the width of the connection portion is equal to or greater than that of the wiring line, and equal to or smaller than that of the land, and the connection portion comprises a non-flat portion therein.

According to the seventh embodiment as described above, the wiring board 1e of the semiconductor device 3e comprises a substrate 13, a solder resist 21b, wiring lines 25, connection portions 26e, and lands 9, and each of the connection portions 26e is provided with a recess 31e as a non-flat portion.

Therefore, the seventh embodiment provides beneficial effects equivalent to those of the first embodiments.

Although in the description of the embodiments above, the present invention is applied to a semiconductor device 3 or to a motherboard 65 on which the semiconductor device 3 is mounted, the present invention is not limited to these applications, but is applicable to any other structures which are required to be electrically connected with the use of a contact member.

It is apparent that the present invention is not limited to the above embodiments, but may be modified and changed without departing from the scope and spirit of the invention.

What is claimed is:

1. A board comprising: a substrate including a first surface; a land provided over the first surface of the substrate and can be mounted a contact member; a wiring line provided over the first surface of the substrate and arranged adjacent to the land; a connection portion electrically coupling the land to the wiring line, the connection portion including a non-flat part, the non-flat part configured to be covered with the contact member; and a solder resist provided over the first surface of the substrate and the wiring line, and does not cover the land and the non-flat part, wherein the connection portion includes a remaining part, and a thickness of the non-flat part is different from a thickness of the remaining part.

2. The board as claimed in claim 1, wherein an area covering the contact member of the non-flat part per a unit area is larger than that of the remaining part per the unit area.

3. The board as claimed in claim 1, wherein the land, the wiring line and the connection portion are a same layer.

4. The board as claimed in claim 1, wherein the connection portion is arranged so as to connect the land and the wiring line in a direction other than the direction of a straight line connecting a center of the land and a center of the substrate.

5. The board as claimed in claim 1, wherein the non-flat part is any one of a through hole, a recess, or a protrusion.

6. A device comprising: a substrate including a first surface and a second surface opposite to the first surface; a semiconductor chip mounted over the first surface of the substrate; a land provided over the second surface of the substrate; a wiring line provided over the second surface of the substrate and arranged adjacent to the land, the wiring line being electrically coupled to the semiconductor chip; a connection portion electrically coupling the land to the wiring line, the connection portion including a non-flat part; a solder resist provided over the second surface of the substrate and the wiring line, and does not cover the land and the non-flat part; and a contact member mounted on the land and the non-flat part, wherein the connection portion includes a remaining part, and a thickness of the non-flat part is different from a thickness of the remaining part.

7. The device as claimed in claim 6, wherein an area covering the contact member of the non-flat part per a unit area is larger than that of the remaining part per the unit area.

8. The device as claimed in claim 6, wherein the land, the wiring line and the connection portion are a same layer.

9. The device as claimed in claim 6, wherein the connection portion is arranged so as to connect the land and the wiring line in a direction other than the direction of a straight line connecting a center of the land and a center of the substrate.

10. The device as claimed in claim 6, wherein the non-flat part is any one of a through hole, a recess, or a protrusion.

11. A device comprising: a first substrate including a first surface; a first land provided over the first surface of the first substrate; a first wiring line provided over the first surface of the first substrate and arranged adjacent to the first land; a first connection portion electrically coupling the first land to the first wiring line; a second substrate stacked over the first surface of the first substrate, the second substrate including a second surface that faces the first surface of the first substrate; a second land provided over the second surface of the second substrate; a second wiring line provided over the second surface of the second substrate and arranged adjacent to the second land; a second connection portion electrically coupling the second land to the second wiring line, the second connection portion including a first non-flat part; a first solder resist provided over the second surface of the second substrate and the second wiring line, and does not cover the second land and the first non-flat part; and a contact member mounting on the first and second lands and covering the first and second lands and the first non-flat part, wherein the second connection portion includes a remaining part, and a thickness of the first non-flat part is different from a thickness of the remaining part.

12. The device as claimed in claim 11, wherein an area covering the contact member of the non-flat part per a unit area is larger than that of the remaining part per the unit area.

13. The device as claimed in claim 11, wherein the second land, the second wiring line and the second connection portion are a same layer.

14. The device as claimed in claim 11, wherein the second connection portion is arranged so as to connect the second land and the second wiring line in a direction other than the direction of a straight line connecting a center of the second land and a center of the second substrate.

15. The device as claimed in claim 11, wherein the non-flat part is any one of a through hole, a recess, or a protrusion.

16. The device as claimed in claim 11, further comprising:
a semiconductor chip mounted over a third surface of the second substrate, the third surface opposite to the second surface of the second substrate, the semiconductor chip being electrically coupled to the second wiring line.

17. The device as claimed in claim 11, further comprising:
a second solder resist layer provided over the first surface of the first substrate and the first wiring line, and does not cover the first land and a second non-flat part included in the first connection portion.

18. The device as claimed in claim 17, wherein the contact member covers the second non-flat part.

* * * * *